(12) United States Patent
Stevens et al.

(10) Patent No.: US 10,256,072 B2
(45) Date of Patent: Apr. 9, 2019

(54) OPTIMIZED SUB-SAMPLING IN AN ELECTRON MICROSCOPE

(71) Applicant: BATTELLE MEMORIAL INSTITUTE, Richland, WA (US)

(72) Inventors: Andrew J. Stevens, Richland, WA (US); Libor Kovarik, West Richland, WA (US); Andrey V. Liyu, Pasco, WA (US); Nigel D. Browning, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 15/666,159

(22) Filed: Aug. 1, 2017

(65) Prior Publication Data

US 2019/0043690 A1 Feb. 7, 2019

(51) Int. Cl.
| | |
|---|---|
| H01J 37/26 | (2006.01) |
| H01J 37/244 | (2006.01) |
| G02B 21/00 | (2006.01) |
| G06K 9/00 | (2006.01) |
| G06T 5/00 | (2006.01) |
| H01J 37/28 | (2006.01) |

(52) U.S. Cl.
CPC .......... *H01J 37/265* (2013.01); *G06K 9/0014* (2013.01); *G06K 9/00134* (2013.01); *G06T 5/005* (2013.01); *H01J 37/244* (2013.01); *H01J 37/28* (2013.01); *G06T 2207/10061* (2013.01)

(58) Field of Classification Search
USPC ................................ 250/251, 281–300, 526
See application file for complete search history.

(56) References Cited

U.S. PATENT DOCUMENTS

| | | | |
|---|---|---|---|
| 6,873,747 B2 | 3/2005 | Askary | |
| 9,620,330 B2 * | 4/2017 | Potoček | ............. G02B 21/0048 |
| 2013/0262028 A1 | 10/2013 | De Prisco et al. | |
| 2015/0069233 A1 * | 3/2015 | Anderson | ............. H01J 37/222 |
| | | | 250/307 |
| 2015/0371815 A1 | 12/2015 | Potocek et al. | |
| 2017/0018073 A1 | 1/2017 | Sungkorn et al. | |
| 2018/0033591 A1 * | 2/2018 | Stanfill | ................ H01J 37/265 |

OTHER PUBLICATIONS

Stevens, A. J., et al., The potential for Bayesian compressive sensing to significantly reduce electron dose in high-resolution STEM images, Miscroscopy 0(0), 1-11, 2013.
Stevens, A. J., et al., Tensor-Dictionary Learning with Deep Kruskal-Factor Analysis, Proceedings of the 20th International Conference on Artificial Intelligence and Statistics, PMLR 54:121-129, 2017.

(Continued)

*Primary Examiner* — Bernard Souw
(74) *Attorney, Agent, or Firm* — Klarquist Sparkman, LLP (57) ABSTRACT

Disclosed are methods for optimized sub-sampling in an electron microscope. With regard at least to utilization of electron dose budgets, of time for acquisition of measurements, and of computing/processing capabilities, very high efficiencies can be achieved by informing and/or adapting subsequent sub-sampling measurements according to one or more earlier-acquired sparse datasets and/or according to analyzes thereof.

21 Claims, 3 Drawing Sheets

(56) References Cited

OTHER PUBLICATIONS

Zhou, M., et al., Nonparametric Bayesian Dictionary Learning for Analysis of Noisy and Incomplete Images, IEEE Transactions on Image Processing, 21, 1, 130-144, 2012.
International Search Report and Written Opinion for related International Application No. PCT/US2018/043486, dated Nov. 9, 2018, 13 pages.

* cited by examiner

OPTIMIZED SUB-SAMPLING IN AN ELECTRON MICROSCOPE

ACKNOWLEDGEMENT OF GOVERNMENT SUPPORT

This invention was made with Government support under Contract DE-AC0576RL01830 awarded by the U.S. Department of Energy. The Government has certain rights in the invention.

FIELD

The present disclosure relates generally to computational imaging techniques and electron microscopy and more particularly to optimizing acquisition of specimen measurements.

BACKGROUND

Advances in analytical instruments, examples of which can include microscopes, spectrometers, and diffractometers, have dramatically improved the quantity and the quality of data obtainable by the instruments. For example, electron microscopy is a powerful tool that can provide high spatial and temporal resolution of nanoscale objects and processes. However, practically speaking, the quantity and quality of information obtainable is now often limited by observer effects on the specimen, the data-handling capacity of associated computational systems, and/or acquisition times that are too long. In the example of electron microscopes, the long dwell time, the high electron beam current, and/or the large amounts of generated data associated with delivering such high resolution and sensitivity can be problematic.

Application of computational imaging techniques, including compressive sensing and inpainting, to reconstruct representations of fully-sampled information from sparse datasets obtained by sub-sampling a specimen can minimize observer effects, acquisition times, and/or data-handling burdens. However, utilization of such techniques has yet to be optimized. Accordingly, there exists a need for improvements in sub-sampling techniques and systems to enable fast and efficient acquisition of measurements in analytical instruments.

SUMMARY

Disclosed are systems and methods for optimized sub-sampling in an electron microscope. The inventors have determined that at least with regard to utilization of electron dose budgets, of time for acquisition of measurements, and of computing/processing capabilities, very high efficiencies can be achieved by informing and/or adapting subsequent sub-sampling measurements according to one or more earlier-acquired sparse datasets and/or according to analyses thereof.

In some embodiments, a method for optimized sub-sampling in an electron microscope comprises performing a computational analysis based on a feature of an initial sparse dataset acquired from an initial sub-sampled measurement of a specimen. The sub-sampled measurement can utilize an initial sub-sampling scheme and an initial electron dose. The method further comprises determining an adapted, sub-sampling scheme based on the computational analysis; and acquiring an adapted sparse dataset from an adapted, sub-sampled measurement of the specimen that utilizes the adapted sub-sampling scheme and an adjusted electron dose.

In certain embodiments, the performing step can further comprise performing a computational analysis based on a plurality of features, a plurality of initial sparse datasets, or both. Certain embodiments further comprise regulating the initial and the adjusted electron doses such that a total electron dose delivered to the specimen is less than or equal to a pre-determined electron dose budget. In certain embodiments, the pre-determined electron dose budget is one of 500 $e^-/Å^2$, 100 $e^-/Å^2$, 50 $e^-/Å^2$, 25 $e^-/Å^2$, 10 $e^-/Å^2$, 5 $e^-/Å^2$, 3 $e^-/Å^2$, 1 $e^-/Å^2$, 0.5 $e^-/Å^2$, 0.1 $e^-/Å^2$, 0.05 $e^-/Å^2$, or 0.01 $e^-/Å^2$. In certain embodiments, the determining step further comprises determining the adjusted electron dose based on the computational analysis. In certain embodiments, the adapted, sub-sampling scheme comprises a serial scan of the specimen. In certain embodiments, the adapted sub-sampled measurement collects pixels not collected by the initial sub-sampled measurement. In certain embodiments, the feature comprises regional intensity maxima, edges, periodicity, pixel uncertainty, pixel importance, pixel variance, or combinations thereof. In certain embodiments, the step of performing a computational analysis further comprises reconstructing a complete image from the initial sparse dataset. Certain embodiments further comprise combining the initial sparse dataset and the adapted sparse dataset into an updated sparse dataset. Certain embodiments further comprise reconstructing a complete image from the initial sparse dataset, the adapted sparse dataset, the updated sparse dataset, or combinations thereof. In certain embodiments, the reconstructing utilizes an inpainting technique. Certain embodiments further comprise repeating said performing, said determining, and said acquiring steps, combining a plurality of the initial sparse datasets and a plurality of the adapted sparse datasets into an updated sparse dataset and reconstructing a complete image from the updated sparse dataset. In certain embodiments, the initial sub-sampling scheme, the adapted sub-sampling scheme, or both comprise a sub-sampling rate that is less than or equal to 80% 50%, 40%, 33%, 30%, 25%, 20%, 15%, 10%, 8%, 5%, 3%, 2%, 1%, 0.5%, or 0.1% of the full sampling rate.

In some embodiments, a method for optimized sub-sampling in electron microscopes comprises acquiring an adapted sparse dataset from an adapted sub-sampled measurement of a specimen using an electron beam probe that utilizes an adapted sub-sampling scheme and an adjusted electron dose, wherein the adapted sampling scheme is determined according to a computational analysis of one or more features of one or more initial sparse datasets acquired from respective initial sub-sampled measurements that utilize respective initial sampling schemes and initial electron doses. Certain embodiments further comprise combining at least one of the one or more initial sparse datasets with the adapted sparse dataset into an updated sparse dataset. Certain embodiments further comprise reconstructing a complete image from the one or more initial sparse datasets, the adapted sparse dataset, the updated sparse dataset, or combinations thereof. In certain embodiments, the sum of the adjusted electron dose and the initial electron doses is less than or equal to a total electron dose budget.

In some embodiments, a non-transitory computer-readable storage medium stores one or more programs, the one or more programs comprising instructions, which when executed by one or more processors of an electronic device in operable communication with an electron microscope, cause the electronic device, the electron microscope, or a sub-system thereof, to acquire an adapted sparse dataset from an adapted sub-sampled measurement of a specimen using an electron beam probe that utilizes an adapted sub-sampling scheme and an adjusted electron dose, wherein the adapted sampling scheme is determined according to a computational analysis of one or more features of one or more initial sparse datasets acquired from respective initial sub-sampled measurements that utilize respective initial sampling schemes and initial electron doses. In certain embodiments, the one or more programs comprise further instructions, which when executed by one or more processors of an electronic device in operable communication with an electron microscope, cause the electronic device, the electron microscope, or a sub-system thereof, to combine the adapted sparse dataset with at least one of the one or more initial sparse datasets into an updated sparse dataset. In certain embodiments, the one or more programs comprise further instructions, which when executed by one or more processors of an electronic device in operable communication with an electron microscope, cause the electronic device, the electron microscope, or a sub-system thereof, to reconstruct a complete image from the initial sparse datasets, the adapted sparse dataset, the updated sparse dataset, or combinations thereof.

The purpose of the foregoing summary and the latter abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. Neither the summary nor the abstract is intended to define the invention of the application, which is measured by the claims, nor is it intended to be limiting as to the scope of the claims in any way.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3A-3C are graphs of quantitative metrics from 200 simulations at various electron doses comparing three sub-sampling schemes including schemes encompassed by embodiments of the present invention.

DETAILED DESCRIPTION

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, molecular weights, percentages, electron doses, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

To facilitate review of the various embodiments of the disclosure, the following explanations of specific terms are provided:

Definitions and Abbreviations

Complete image as used herein means an image resulting from full, pixel-by-pixel sampling or from computational imaging reconstruction.

Imputed value as used herein means a computationally determined data point that is imputed using a mathematical technique, for example, one associated with inpainting.

Inpainting as used herein means the imputation of missing image pixels. This can be achieved using external information, such as a library of similar images or trained statistical models (e.g., neural networks), but also using only the reduced set of pixels from the image to be inpainted (e.g. beta-process factor analysis).

Jittered as used herein refers to various disclosed embodiments of sub-sampling with an analytical probe wherein grid points are shifted randomly from the grid locations within a fixed radius. In one example, $(x,y)=(1,2)\rightarrow(1+r,2+r)$, where r is a random number between −0.5 and −0.5). The pixel grid can have a finer scale than the jittering grid, and the jittered points are discretized into the pixel grid after jittering. The grid points are usually Cartesian (integer tuples) or Hexagonal, but other sampling grids exist and are compatible.

Line-hopping as used herein refers to various disclosed embodiments of sub-sampling with an analytical probe wherein the analytical probe acquires in a serial mode a plurality of contiguous measured values lying at positions along a scan path extending in a line toward a first direction and having random perturbations in a second direction, wherein the random perturbations are limited within a predetermined distance from the line.

Non-transitory as used herein when referring to a computer-accessible medium, is a limitation of the medium itself (i.e., tangible, not a propagating electromagnetic signal) as opposed to a limitation on data storage persistency. The term is not intended to otherwise limit the type of physical computer-readable storage device that is encompassed by the phrase computer-accessible medium or memory. For instance, the terms "non-transitory computer readable medium" or "tangible memory" are intended to encompass types of storage devices that do not necessarily store information permanently, including but not limited to, computer-readable media that store data only for short periods of time and/or only in the presence of power, such as register memory, processor cache and Random Access Memory (RAM). Program instructions and data stored on a tangible computer-accessible storage medium in non-transitory form may further be transmitted by transmission media or signals such as electrical, electromagnetic, or digital signals, which may be conveyed via a communication medium such as a network and/or a wireless link.

Pixel as used herein in the context of an image means the basic logical unit in the image. As used herein in the context of sampling a specimen using an analytical probe, a pixel can refer to the basic logical unit in the scan region. Depending on the resolution of the image and the sampling rate of the analytical probe, a pixel in the image can represent one or more actual measurement positions where sampling by the analytical probe occurred. The relationship between sampling distance at the specimen and pixel size at the image can be described as the size of the pixel divided by the magnification in the image is equivalent to the sampling distance.

Serial acquisition, or serial mode referring to acquisition, as used herein means acquiring data in serial order at particular positions as the analytical probe traverses a scan region of the specimen along a scan path. At each sampling position along the scan path in a single scan, acquisition of a measured value is performed. In contrast, a parallel acquisition performs a plurality of acquisitions, wherein each acquisition encompasses an entirety of a scan region.

Sparse as used herein refers to data coming from analytical probes, detectors, and/or sensors and subsequently arranged in an array or matrix, wherein most of the elements are empty or zero. Sparse sampling, as used herein, refers to sub-sampling such that the result is an array of data that is sparse. Sparsity is a necessary condition for data to be processed according to many computational imaging techniques including those of compressive sensing and inpainting.

STEM as used herein means scanning transmission electron microscope.

Sub-sampling as used herein means using an analytical probe to sample a specimen at fewer acquired positions than the maximum possible. It can refer to acquiring measurements at a rate that is less than the full, pixel-by-pixel sampling rate of an analytical probe in an analytical instrument. In some embodiments, the sub-sampling rate is less than or equal to 80% of the full sampling rate. In certain embodiments, the sub-sampling rate is less than or equal to 80%, 50%, 40%, 33%, 30%, 25%, 20%, 15%, 10%, 8%, 5%, 3%, 2%, or 1% of the full sampling rate.

Sub-sampled image as used herein means a visual representation of a sparse dataset without the application of computational imaging techniques to generate a complete image.

Sparse dataset as used herein means at least one set of data values comprising measurements from a sub-sampled scan of a specimen Video as used herein means a series of still images, which when displayed on a visual medium creates an illusion of motion.

Developments in electron microscopy have already significantly improved their sensitivity and their ability to obtain high-resolution measurements. For example, aberration correctors for scanning transmission electron microscopes (STEM) have led to a spatial resolution limit better than 0.5 $Å^2$ for imaging inorganic crystalline samples. Accompanying this high level of spatial resolution is a simultaneous increase in image sensitivity that is primarily caused by increased beam current in the sub-angstrom electron probe used to form the image in STEM. While this is incredibly beneficial for achieving atomic resolution in analytical methods such as electron energy loss spectroscopy (EELS) and energy dispersive X-ray spectroscopy (EDS), the high beam current (typically resulting in an electron dose on the sample that is in excess of $10^5$-$10^6$ $e^-/Å^2$) drastically reduces the number of different types of specimens that are stable under these illumination conditions. The applicability of high spatial-resolution STEM, and other electron microscope instruments, can be greatly expanded by sampling methods and systems for extremely low-dose conditions such as those disclosed herein. This will be especially impactful to certain embodiments described herein, where the specimen comprises dynamic materials processes in-situ, or beam-sensitive materials (e.g., organics).

The traditional means of decreasing dose in serial acquisitions (e.g., STEM, SEM, etc.) is to scan faster (i.e., lower the electron dose by using a reduced pixel dwell time) or reduce the gun extraction voltage (reducing the number of electrons emitted). Both approaches can experience difficulties; for example, the scan speed can exceed the stability of the deflector coils or the reduced extraction voltage misaligns the corrector (the beam cross-overs are changed). Compressive sensing and/or inpainting, which utilize the concept that images/data can be well represented in a much sparser form using a suitable basis set, and that this sparse form can be fully recovered from a measurement that has a much lower sampling than the conventional acquisition can be utilized to address the problems described herein. However, the application of these computational imaging techniques has not been optimized in terms of its relationship to sub-sampling, and/or data acquisition schemes.

The inventors have determined that adapting and/or informing sub-sampled measurements of a specimen using previously acquired sparse datasets can result in optimized operation of electron microscopes, wherein electron dose, acquisition time, and generated data volume are minimized, while sensitivity, image quality, and/or resolution are maximized according to an operator's needs. Accordingly, using the embodiments disclosed herein can help achieve the greatest resolution and/or contrast per unit electron dose delivered to a specimen. In certain embodiments, an electron dose budget is pre-determined. The pre-determined electron dose budget can be based on an observer effect threshold or damage threshold of a given specimen. Alternatively, it can be based on a desired acquisition time (e.g., dwell time). In some embodiments, the pre-determined electron dose budget is less than or equal to 100 $e^-/Å^2$. In other embodiments, the pre-determined electron dose budget is 50, 25, 10, 5, 1, 0.8, 0.5, or 0.1 $e^-/Å^2$.

In some embodiments, contrary to expectations, minimizing observer effects and/or decreasing acquisition time is not merely achievable by reducing electron dose. Electron dose reduction can be viewed as a Poisson process. In other words, if the delivered dose is reduced to a low enough amount, it will not yield a sufficient measurement and no data will exist at various pixels, or regions of the specimen. At unacceptably low electron doses, the specimen will be affected, but potentially no usable data will be acquired. Accordingly, in some embodiments, fewer pixels are sampled, but the electron dose at each sampled pixel is increased. In certain embodiments, the amount of electron dose increase is proportional to the degree of sub-sampling. For example, a specimen can be sub-sampled at 10% and the electron dose can be increased by 10 times, relative to a conventional full scan and/or a conventional sub-sampling scheme. The total electron dose delivered can be limited to a value less than or equal to the pre-determined electron dose budget. The resulting sparse dataset has a high signal-to-noise ratio at each measured pixel, but has very few measured pixels. In some embodiments, a computational analysis based on a given feature is then performed on the sparse dataset to determine an adapted sub-sampling scheme for a subsequent measurement.

According to embodiments described herein, a pre-determined electron dose budget, can be distributed among a plurality of sub-sampling measurements. For example, an initial sub-sampling measurement can deliver 50% of the pre-determined electron dose budget in a first scan to yield an initial sparse dataset. Computational analysis along with optional reconstruction of a complete image can be used to determine an adapted sub-sampling scheme. An adapted sub-sampling measurement based on the adapted sub-sampling scheme can be performed while applying the remainder of the pre-determined electron dose budget.

Figure 1:
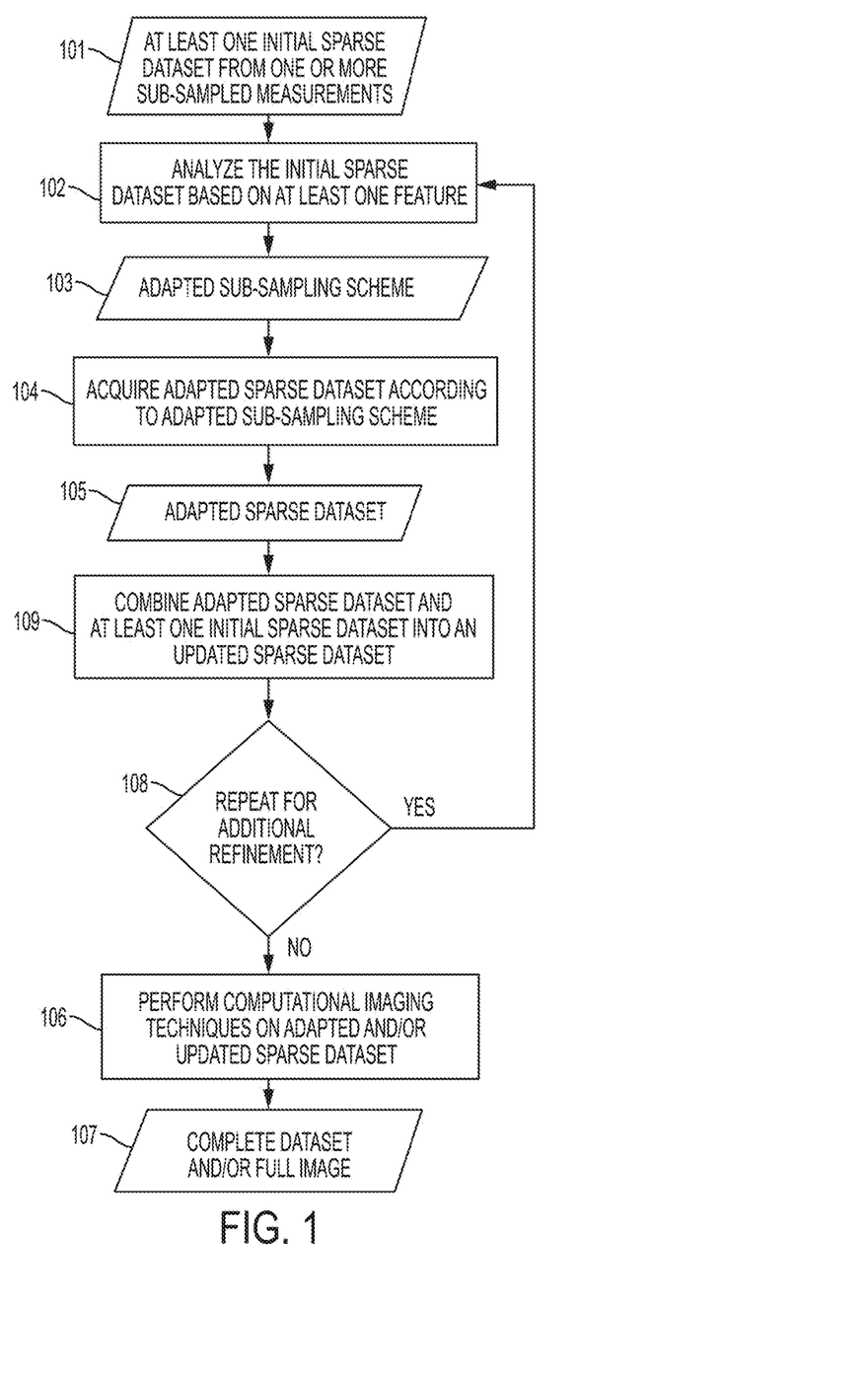
FIG. 1 is an illustration of a flow chart representing one embodiment of the present invention.

FIG. 1 is a flow chart illustrating one embodiment for optimized sub-sampling in an electron microscope. At least one initial sparse dataset is provided 101 for computational analysis. The initial sparse dataset can be acquired from one or more sub-sampled measurements. In one example, the initial sparse dataset comprises a plurality of sparse datasets, each acquired from a sub-sampled measurement, or scan, of a specimen. The plurality of sparse datasets can be combined into a single initial sparse dataset for analysis. Alternatively, each sparse dataset can be treated as an individual initial sparse dataset and analyzed one at a time. The sub-sampled measurement yielding an initial sparse dataset can utilize an initial sub-sampling scheme and an initial electron dose. The initial sub-sampling scheme can comprise a random scheme. The initial sub-sampling scheme can comprise less than or equal to 90%, 80%, 70%, 60%, 50%, 40%, 30%, 25%, 20%, 15%, 10%, 5%, 3%, 2%, 1%, 0.5% of the samplings compared to a full-sampling scheme. The initial electron dose can comprise less than or equal to 50, 25, 10, 5, 1, 0.8, 0.5, or 0.1 $e^-/Å^2$.

Computational analysis 102 of the initial sparse dataset can be based on one or more features of the initial sparse dataset. Examples of features can include, but are not limited to, regional intensity maxima, edges, periodicity, regional chemical composition, or combinations thereof. The features can represent physical and/or chemical characteristics of the specimen. For example, intensity maxima in the data can represent peaks associated with particles, molecules, and/or atoms. Edges can represent particle boundaries, grain boundaries, crystalline dislocations, stress/strain boundaries, interfaces between different compositions/crystalline structures, and combinations thereof. Periodicity can be related to crystallinity and/or patterned objects. The features can be determined directly from the dataset, inferred from the dataset, and/or provided as input for the analysis. For example, a specimen's estimated composition and/or crystalline structure can be provided when known. Alternatively, the periodicity of intensity maxima observed directly from the dataset can be identified and selected as the feature for computational analysis. Further still, the crystalline structure can be inferred from diffraction data and/or periodicity given information regarding chemical composition of the specimen. Examples of computational analysis can include, but are not limited to, a theoretically optimal sparsifying transform technique, an edge detection technique, a Gaussian mixture regression technique, a summary statistics technique, a measures of spatial variability technique, an entropy technique, a matrix decomposition information technique, a peak finding technique, or a combination thereof. The computational analysis can be performed directly on a sparse dataset. Alternatively, the computational analysis can be performed on a complete dataset reconstructed from a sparse dataset by the application of one or more computational imaging techniques, including but not limited to inpainting.

The computational analysis can provide an adapted sub-sampling scheme 103. In some embodiments, the computational analysis identifies regions of highest uncertainty in the dataset. For example, variance at each pixel can be quantified. The pixels having the highest measure for variance represents a region of high uncertainty. Such a region can be included in the adapted sub-sampling scheme so that subsequent sub-sampling measurements can be used to refine that region and the resultant sparse dataset.

Based on the adapted sub-sampling scheme, an adapted sub-sampling measurement is performed 104 to acquire an adapted sparse dataset 105. In certain embodiments, the computational analysis and/or the reconstruction are implemented on a time-scale less than the time required for a subsequent measurement (e.g., scan of the specimen). In other words, an adapted sub-sampling scheme is provided to the electron beam probe sub-system sufficiently quickly to inform a future sub-sampling measurement. Drift and other time-dependent artefacts can affect the time-scale in which the computational analysis occurs. In one example, adapted scans must be completed before drift shifts the sampling region. In certain embodiments, the time-scale of the computational analysis is less than or equal to 0.1 s, 0.05 s, 0.01 s, 0.005 s, 0.001 s, 0.0005 s, 0.0001 s, 0.00005 s, 0.00001 s, $5\times10^{-5}$ s, $1\times10^{-5}$ s, $5\times10^{-6}$ s, and $1\times10^{-6}$ s.

In some embodiments, the adapted sub-sampling measurement delivers an electron dose that is less than or equal to the balance of the pre-determined electron dose budget. In certain embodiments, the adapted sub-sampling measurement samples pixels not previously sampled by earlier sub-sampling measurements. In certain embodiments, a movie comprising a sequence of images is generated. In such instances, at least some pixels can be sampled at least twice. The images can be reconstructed from the sparse datasets using a computational imaging technique, including but not limited to inpainting.

At least one sparse dataset and at least one initial sparse dataset are combined 109 to generate an updated sparse dataset. In some embodiments, the analysis of previous sparse datasets to generate adapted sub-sampling schemes can be repeated 108 in order to converge on an updated sparse dataset having a desired degree of refinement and/or resolution. In such cases, an adapted sparse dataset and/or an updated sparse dataset from one iteration can be provided as an initial dataset for a subsequent iteration. In certain embodiments, some adapted sparse datasets can be rejected. For example, after a number of iterations, specimen damage from overexposure to the electron beam is observable, latter iterations can be rejected to obtain the highest quality datasets.

In certain embodiments, after obtaining a sufficiently refined updated sparse dataset, computational imaging techniques can be applied 106 in order to generate a complete dataset and/or complete image 107. One non-limiting example of a computational imaging technique includes inpainting, which can impute un-sampled data values among sampled measurement values.

The algorithms, computational techniques, and/or calculations described herein may be, for example, embodied as software or firmware instructions carried out by a digital computer and/or processing circuitry. For instance, any of the disclosed computational analysis, determination of adapted sub-sampling schemes, combining of initial and adapted sub-sampling schemes, computational imaging techniques, and/or data analysis techniques can be performed by a computer or other computing hardware (e.g., an ASIC, FPGA, CPLD, processor, etc.) that is part of a sensor system and/or an analytical instrument. The sensor system can have interconnections and communications among an analytical probe, a detector, and/or an analytical instrument control system and can be programmed or configured to read a data storage medium and perform the desired sampling scheme adaptation, imaging, and/or analysis computations (e.g., one or more of the analysis techniques disclosed herein). The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The media can comprise initial sparse datasets, adapted sparse datasets, updated sparse datasets, complete datasets, complete images, sub-sampled images, initial sub-sampling schemes, adapted sub-sampling schemes, and combinations thereof. The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed estimation techniques. The results of the computations and analysis, can be stored (e.g., in a suitable data structure or lookup table) in the one or more tangible, non-transitory computer-readable storage media and/or can also be used by other software programs, communicated to an instrument control system, or output to the user, for example, by displaying, on a display device, data read from the data storage medium. The results that are stored or outputted can include, but are not limited to, images, micrographs, video, spectra, diffraction patterns, hyperspectral images, operational commands, sparse datasets, complete datasets, sub-sampling schemes, and combinations thereof.

EXAMPLES AND COMPARISONS

To further illustrate certain embodiments of the disclosed cathode materials, cathodes, battery systems and methods of making the same, and to provide various comparative analyses and data, below are some Examples with comparison test data.

Figure 2:
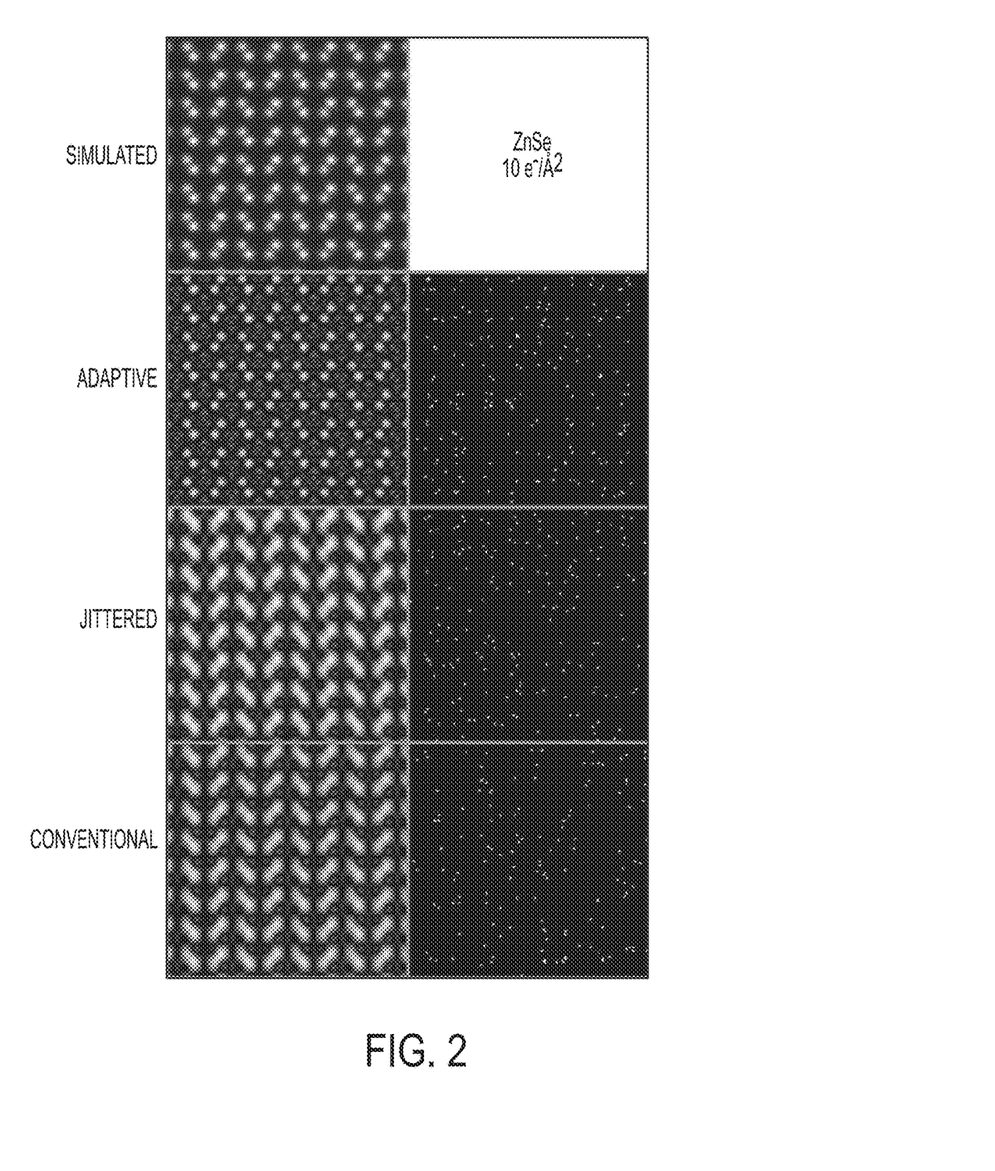
FIG. 2 contains images comparing sampling schemes based on simulated results of a ZnSe specimen.

Comparing an Adapted Sub-Sampling Scheme with Other Sampling Schemes:

Referring to FIG. 2, simulations of Z-contrast images for ZnSe, which is a standard test sample for atomic resolution STEM compare representative reconstructions for a dose of 10 $e^-/Å^2$. The left column, from top to bottom, show simulated computationally reconstructed complete images for an adapted sub-sampling scheme, a random jittered scheme, and a conventional full sampling (i.e., pixel-by-pixel) scheme at very low electron dose rate. The right column contains images of the simulated sparse datasets, wherein white pixels represent electron counts greater than zero. Resolution and contrast metrics are shown in Table 1.

Referring to the images of the low-dose, conventional sampling images, uniform dose reduction causes an apparent sub-sampling effect. The inventors have determined that most of the dose is wasted in regions producing zero electron detections. The images were simulated using the multi-slice frozen phonon image simulation method in QSTEM.

The images shown in FIG. 2 represent three different dose strategies and sub-sampling measurement approaches to obtain high resolution images in a STEM instrument. The first is an adapted sub-sampling, which begins with an initial Cartesian jittered random sub-sampling. Subsequent sub-sampling schemes were adapted to sample the regional maxima identified in a previous sub-sampling measurement. Each sub-sampling measurement collected pixels that were not previously collected. As described elsewhere herein, this has the effect of delivering the electron dose in the expected atom column locations. The adapted sub-sampling scheme is based on a periodic character of the specimen that can be observed in the dataset via the regional maxima. The second strategy uses jittered (non-adapted) random sub-sampling. In the subsampling approaches, 10% of the pixels are used, and the dose is kept consistent with the fully sampled images by increasing the Poisson mean in each sampled pixel by the fraction of sub-sampling (i.e., the sub-sampled dose in a pixel is ten times the dose in a pixel of the fully sampled image, making the total dose the same). Third is conventional imaging, whereby the intensity of the image is lowered uniformly in each pixel, which would be the equivalent of the beam current or dwell time being lowered to reduce the dose).

The reconstructed images (in the left column) for each sampling scheme use the same algorithm. First, the Fourier transform (FT) is computed. Next, a punctured median filter is used to find the peaks and filter-out non-peak regions in the magnitude image. Finally, the magnitude beyond a maximum spatial frequency is set to zero and the inverse transform gives the reconstructed image. In the adapted sub-sampling scheme, this reconstruction procedure is used for each adaptive iteration. The reconstruction approach uses the theoretically optimal sparsifying transform (Fourier) for periodic "Dirac"-structured data specified by compressive sensing theory. Examples of algorithms for analyzing non-periodic specimen include, but are not limited to variants of beta process factor analysis where an estimate of the image posterior distribution (given the current pixel samples) can be computed and used to identify regions of uncertainty (e.g. a pixel with high variance) to be used as new sample locations.

TABLE 1

Resolution and Contrast metrics for the images shown in FIG. 2. ZnSe resolution is inter-dumbbell (not atomic).

| Method | GaAs specimen (10 $e^-/Å^2$ dose) | | ZnSe specimen (10 $e^-/Å^2$ dose) | |
| --- | --- | --- | --- | --- |
| | Resolution (Å) | Contrast | Resolution (Å) | Contrast |
| Simulated | 0.6115 | 1.115 | 0.6414 | 1.237 |
| Adapted | 0.4083 | 1.138 | 0.5560 | 1.330 |
| Jittered | 0.5886 | 1.119 | 0.8 | 1.114 |
| Pixel-by-Pixel | 0.5892 | 1.020 | 0.8 | 1.188 |

Figure 3A:
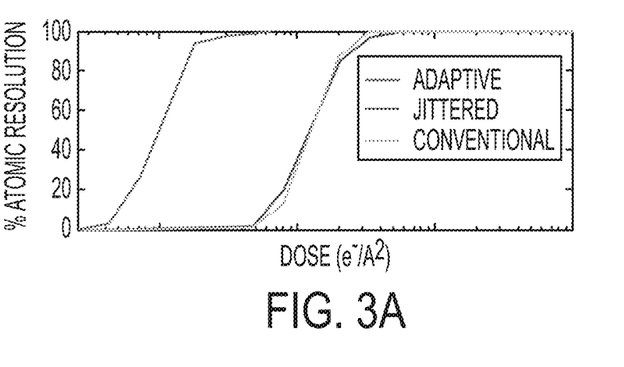
FIG. 3A is a graph of percentage atomic resolution as function of electron dose.
Figure 3B:
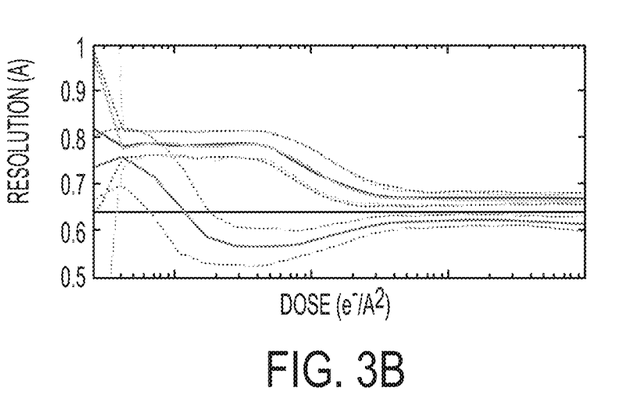
FIG. 3B is a graph of resolution as a function of electron dose.
Figure 3C:
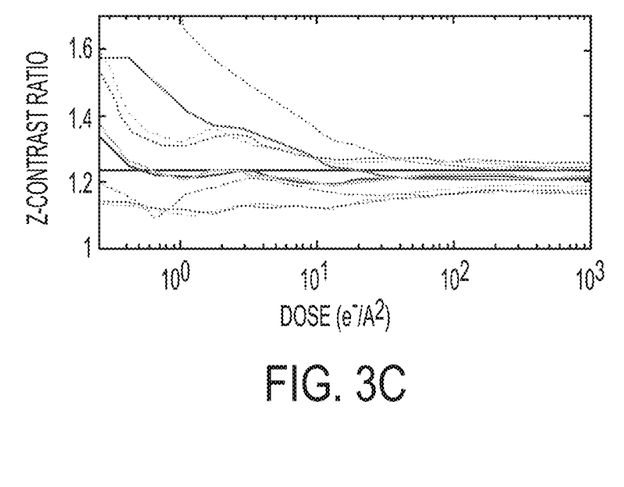
FIG. 3C is a graph of Z-contrast ratio as a function of electron dose.

Resolution and sensitivity/contrast are standard STEM image quality metrics. The metrics for the images in FIG. 2 are shown in Table I. Because of the randomness in the sub-sampling and application of Poisson noise, an ensemble of 200 reconstructions were performed at each dose. The noise and random sampling are different for each reconstruction. The mean±1 standard deviation of each metric from the ensemble of reconstructions are shown in FIG. 3. The resolution is computed using the Rayleigh criterion: the distance along the line between the peaks from the lower peak to the first point at 81% intensity of the peak (when the trough is greater than 81%, the peaks are not resolved). Contrast is determined from the peak ratios using a quasi-unbiased ratio estimate. At doses above approximately 100 $e^-/Å^2$, the resolution and contrast converge to the simulated values as dose increases (see FIG. 3). At lower doses, the jittered (red lines) and conventional (orange lines) schemes produce approximately the same resolution and contrast, whereas the adapted (blue lines) scheme can extend atomic imaging to doses below 1 $e^-/Å^2$. FIG. 3A shows a phase transition for obtaining atomic resolution—this is the probability that the dumbbells in the reconstructed image pass the Rayleigh criterion. FIGS. 3B and 3C show the mean (solid lines) and standard deviation (dotted lines) for resolution and contrast. The metrics for the simulated image are solid black. A trough can be seen on the adapted sub-sampling scheme resolution curve, which occurs because the adaptation to the peaks is significant enough to super-resolve the image.

The results shown in FIG. 3 provide an intuitive understanding of how embodiments described herein can improve low-dose imaging. In the comparison between the jittered sampling scheme and the conventional sampling scheme, the sensitivity and resolution is essentially the same. This means that however the dose is applied (either by picking the pixels or lowering the dose uniformly), the images are the same quality. But, sub-sampling provides a substantial increase to acquisition speed. If the dwell time is the same for each sampling method, the sub-sampled approach reduces the number of pixels by an order of magnitude, and can also reduce flyback and settling time. For example, in many electromagnetic STEM scans the probe runs from left to right and at the end of each line "flies back" to the start of the scan and settles for a duration approximately 100 times the normal pixel dwell time before scanning again. Accompanied by this increase of speed, the system also generates less data, so the data transfer/storage for imaging is also reduced by an order of magnitude. In many embodiments, the reduction in sub-sampling rate is proportional to the reduction in the data transfer/storage burden.

The adapted sampling scheme maintains the advantages of subsampling, but can also improve resolution. The reason for this is that an initial sub-sampled scheme and initial electron dose can be used initially to recover a lower resolution image, and then this image can be used to sample pixels in a second sub-sampled scan to provide more of the missing information (i.e., by estimating the atomic column locations). By adapting to the structure being imaged, the dose can be lowered significantly for the same resolution, or the resolution can be extended for the same dose. The reconstructed images show the same traits in terms of resolution. As dose decreases, it is harder to resolve the atomic dumbbells (see FIGS. 2 and 3) and to obtain the correct contrast. In addition, the ZnSe simulation show that as the Z-ratio increases it is easier to determine the crystal composition. In the adaptive case, the basic approach adopted (i.e., sampling more in the areas of the highest reconstructed intensity) causes a higher Z-contrast than expected. Combining crystallographic information as a feature during the computational analysis, as described elsewhere herein, can rectify this issue. Crystallographic image processing (i.e., Fourier peak-finding) is one approach to adding crystallographic information to the analysis.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A method for optimized sub-sampling in an electron microscope, the method comprising:
   a) Performing a computational analysis based on a feature of an initial sparse dataset acquired from an initial sub-sampled measurement of a specimen, the sub-sampled measurement utilizing an initial sub-sampling scheme and an initial electron dose;
   b) Determining an adapted, sub-sampling scheme based on the computational analysis; and
   c) Acquiring an adapted sparse dataset from an adapted, sub-sampled measurement of the specimen that utilizes the adapted sub-sampling scheme and an adjusted electron dose.

2. The method of claim 1, wherein said performing step further comprises performing a computational analysis based on a plurality of features, a plurality of initial sparse datasets, or both.

3. The method of claim 1, further comprising regulating the initial and the adjusted electron doses such that a total electron dose delivered to the specimen is less than or equal to a pre-determined electron dose budget.

4. The method of claim 3, wherein the pre-determined electron dose budget is one of 500 $e^-/Å^2$, 100 $e^-/Å^2$, 50 $e^-/Å^2$, 25 $e^-/Å^2$, 10 $e^-/Å^2$, 5 $e^-/Å^2$, 3 $e^-/Å^2$, 1 $e^-/Å^2$, 0.5 $e^-/Å^2$, 0.1 $e^-/Å^2$, 0.05 $e^-/Å^2$, or 0.01 $e^-/Å^2$.

5. The method of claim 1, wherein said determining step further comprises determining the adjusted electron dose based on the computational analysis.

6. The method of claim 1, wherein the adapted, sub-sampling scheme comprises a serial scan of the specimen.

7. The method of claim 1, wherein the adapted sub-sampled measurement collects pixels not collected by the initial sub-sampled measurement.

8. The method of claim 1, wherein the feature comprises regional intensity maxima, edges, periodicity, pixel uncertainty, pixel importance, pixel variance, or combinations thereof.

9. The method of claim 1, wherein said performing a computational analysis further comprises reconstructing a complete image from the initial sparse dataset.

10. The method of claim 1, further comprising combining the initial sparse dataset and the adapted sparse dataset into an updated sparse dataset.

11. The method of claim 10, further comprising reconstructing a complete image from the initial sparse dataset, the adapted sparse dataset, the updated sparse dataset, or combinations thereof.

12. The method of claim 11, wherein said reconstructing utilizes an inpainting technique.

13. The method of claim 1, further comprising repeating said performing, said determining, and said acquiring steps, combining a plurality of the initial sparse datasets and a plurality of the adapted sparse datasets into an updated sparse dataset and reconstructing a complete image from the updated sparse dataset.

14. The method of claim 1, wherein the initial sub-sampling scheme, the adapted sub-sampling scheme, or both comprise a sub-sampling rate that is less than or equal to 80%, 50%, 40%, 33%, 30%, 25%, 20%, 15%, 10%, 8%, 5%, 3%, 2%, 1%, 0.5%, or 0.1% of a full sampling rate.

15. A method for optimized sub-sampling in electron microscopes, the method comprising acquiring an adapted sparse dataset from an adapted sub-sampled measurement of a specimen using an electron beam probe that utilizes an adapted sub-sampling scheme and an adjusted electron dose, wherein the adapted sampling scheme is determined according to a computational analysis of one or more features of one or more initial sparse datasets acquired from respective initial sub-sampled measurements that utilize respective initial sampling schemes and initial electron doses.

16. The method of claim 15, further comprising combining at least one of the one or more initial sparse datasets with the adapted sparse dataset into an updated sparse dataset.

17. The method of claim 16, further comprising reconstructing a complete image from the one or more initial sparse datasets, the adapted sparse dataset, the updated sparse dataset, or combinations thereof.

18. The method of claim 15, wherein the sum of the adjusted electron dose and the initial electron doses is less than or equal to a total electron dose budget.

19. A non-transitory computer-readable storage medium storing one or more programs, the one or more programs comprising instructions, which when executed by one or more processors of an electronic device in operable communication with an electron microscope, cause the electronic device, the electron microscope, or a sub-system thereof, to acquire an adapted sparse dataset from an adapted sub-sampled measurement of a specimen using an electron beam probe that utilizes an adapted sub-sampling scheme and an adjusted electron dose, wherein the adapted sampling scheme is determined according to a computational analysis of one or more features of one or more initial sparse datasets acquired from respective initial sub-sampled measurements that utilize respective initial sampling schemes and initial electron doses.

20. The non-transitory computer-readable storage medium of claim 19, wherein the one or more programs comprise further instructions, which when executed by one or more processors of an electronic device in operable communication with an electron microscope, cause the electronic device, the electron microscope, or a sub-system thereof, to combine the adapted sparse dataset with at least one of the one or more initial sparse datasets into an updated sparse dataset.

21. The non-transitory computer-readable storage medium of claim 20, wherein the one or more programs comprise further instructions, which when executed by one or more processors of an electronic device in operable communication with an electron microscope, cause the electronic device, the electron microscope, or a sub-system thereof, to reconstruct a complete image from the initial sparse datasets, the adapted sparse dataset, the updated sparse dataset, or combinations thereof.

* * * * *